United States Patent
Miller et al.

(10) Patent No.: US 6,255,582 B1
(45) Date of Patent: *Jul. 3, 2001

(54) METHOD AND APPARATUS FOR CONNECTING SHIELDING GROUND PLANE OF A FLEX CABLE TO A GROUNDING PAD ON A PRINTED WIRE BOARD

(75) Inventors: William Michael Miller, Rocklin; Curtis Allen Bonville, Roseville, both of CA (US)

(73) Assignee: Hewlett-Packard Company, Palo Alto, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/280,158

(22) Filed: Mar. 29, 1999

(51) Int. Cl.⁷ ...................................................... H05K 9/00
(52) U.S. Cl. ..................... 174/35 C; 174/35 R; 361/818; 361/816
(58) Field of Search ............................... 174/35 R, 35 C, 174/36, 254; 361/818, 816; 439/67, 77

(56) References Cited

U.S. PATENT DOCUMENTS

| | | | |
|---|---|---|---|
| 3,612,744 | * 10/1971 | Thomas | 174/36 |
| 4,184,729 | * 1/1980 | Parks et al. | 339/17 F |
| 4,644,092 | * 2/1987 | Gentry | 174/36 |
| 4,845,311 | * 7/1989 | Schreiber et al. | 174/36 |
| 5,448,020 | * 9/1995 | Pendse | 174/250 |
| 5,669,775 | * 9/1997 | Campbell et al. | 439/77 |

* cited by examiner

Primary Examiner—Dean A. Reichard
Assistant Examiner—W. David Walkenhorst

(57) ABSTRACT

A grounding arrangement for the shielding ground plane of a flex cable is used to provide electrical signal connections between a circuit item having a flex cable connector thereon and a physically separate electrical circuit element. The flex cable connector is mounted on the printed wire board a short distance from one edge thereof. A grounding pad is formed on the circuit item between the flex cable connector and one edge of said circuit element. An access window is formed in the flex cable adjacent the connector end thereof to provide access to the shielding ground plane thereof, the window being adapted to provide electrical signal communication, directly or by means of a conductive adhesive layer, between the shielding ground plane of the flex cable and the grounding pad on the circuit item when the connector end of the flex cable is received in the flex cable connector.

4 Claims, 4 Drawing Sheets

METHOD AND APPARATUS FOR CONNECTING SHIELDING GROUND PLANE OF A FLEX CABLE TO A GROUNDING PAD ON A PRINTED WIRE BOARD

FIELD OF THE INVENTION

This invention relates generally to methods and apparatus for connection two circuit elements via a flex cable, and more specifically to methods and apparatus for connecting a ground shield plane of a flex cable to a grounding pad on circuit element comprising a printed wire board or a metal chassis to provide effective EMI/ESD grounding by the ground shield plane of the flex cable.

BACKGROUND OF THE INVENTION

State of the art electrical circuit designs require improved EMI and ESD suppression. To achieve this in an arrangement in which one or more electrical components are mounted external to a printed wire board or chassis and connected via a flex cable requires that the flex cable include a ground plane separate from and insulated from the conductive traces of the cable and that this ground plane be effectively connected to a grounding pad on the printed wire board.

FIG. 1 illustrates a prior art flex cable arrangement in which the component mounted to pads 12 on flex cable 10 are provided with ground only through a separate set of traces 11. This arrangement may provide ineffectual EMI/ESD shielding.

FIGS. 2 and 3 illustrate a prior art flex cable shield grounding arrangement. Flex cable 20 has conductive cable traces 24 extending between component connection points 22 and a connector region 20A which is inserted into a flex cable connector 40 mounted on printed wire board 31. FIG. 3 illustrates the structure of the flex cable and the grounding structure 21 to ground the copper shielding layer 26 to a grounding pad 32 on a printed wire board 31. A plated through hole 30 extends through the various layers of the flex cable, i.e. stiffener 28, polyamide 27, copper layer 26, polyamide 25, traces 24, and polyamide 23. The plated through hole contacts copper shielding layer 26 and, together with screw 29, provides a conductive connection to grounding pad 32. This ground arrangement may not provide sufficient EMI/ESD shielding for many flex cable applications and also requires extra steps in cable manufacture and assembly of the cable into the final product.

OBJECTS OF THIS INVENTION

It is the principal object of this invention to provide an improved method and apparatus for connecting a ground shield plane of a flex cable to a grounding pad on a circuit element comprising a printed wire board or metal chassis to provide effective EMI/ESD grounding of the ground shield plane of the flex cable.

FEATURES AND ADVANTAGES OF THIS INVENTION

This invention features a method for connecting the shielding ground plane of a flex cable to a grounding pad on a circuit element comprising a printed wire board or metal chassis to which the flex cable is connected. For purposes of this discussion, a printed circuit board will be used as the circuit element. A flex cable connector is mounted on the printed wire board at a prearranged location. The printed wire board has formed thereon a grounding pad positioned adjacent to the flex cable receiving portion of the flex cable connector. The flex cable has formed thereon adjacent to the connector end thereof an access window in the flex cable layers overlying the shielding ground plane sized to allow sufficient connection to the shielding ground plane of the flex cable. The connector end of the flex cable is inserted into the flex cable connector on the printed wire board. The access window in the flex cable is placed over the grounding pad to make an electrical connection between the grounding pad and the shielding ground plane of the flex cable across substantially the entire area of the access window.

This provides a more effective grounding of the EMI/ESD shielding layer and thus more effective EMI/ESD shielding of the conductive traces of the cable and the component mounted on the flex cable.

Preferably the method further comprising forming a layer of conductive adhesive material in the access window in the flex cable layers or on the grounding pad on the printed wire board. In this embodiment, the flex cable and the printed wire board are pressed together where the layer of conductive adhesive has been formed to adhere the exposed ground plane of the flex cable to the grounding pad and to provide electrical connection between the grounding pad and the shielding ground plane of the flex cable.

Other objects, features and advantages of this invention will be apparent from a consideration of the detailed disclosure, claims and drawing figures.

DETAILED DESCRIPTION OF THE INVENTION EMBODIMENTS

Figure 1:
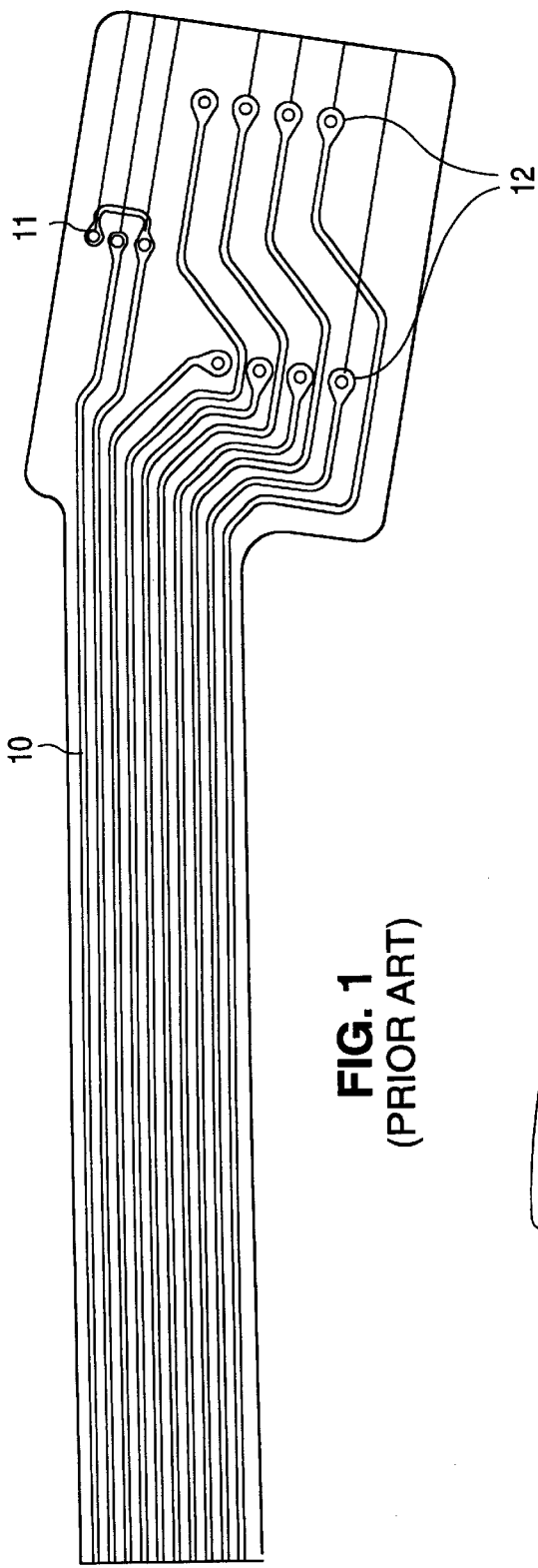
FIG. 1 illustrates a prior art flex cable arrangement.
Figure 2:
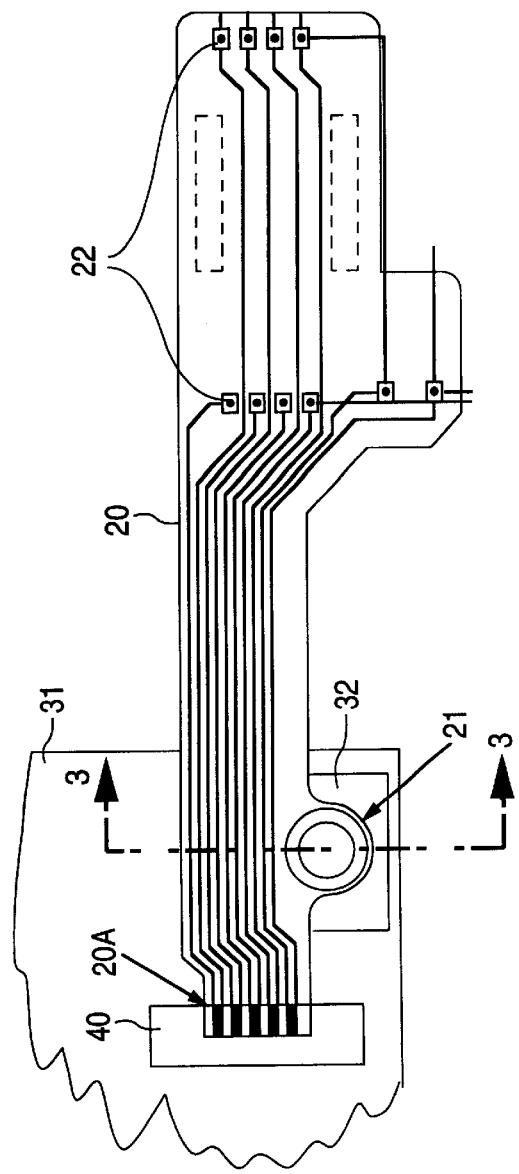
FIGS. 2 and 3 illustrate another prior art flex cable arrangement with a particular form of prior art grounding tab arrangement.
Figure 3:
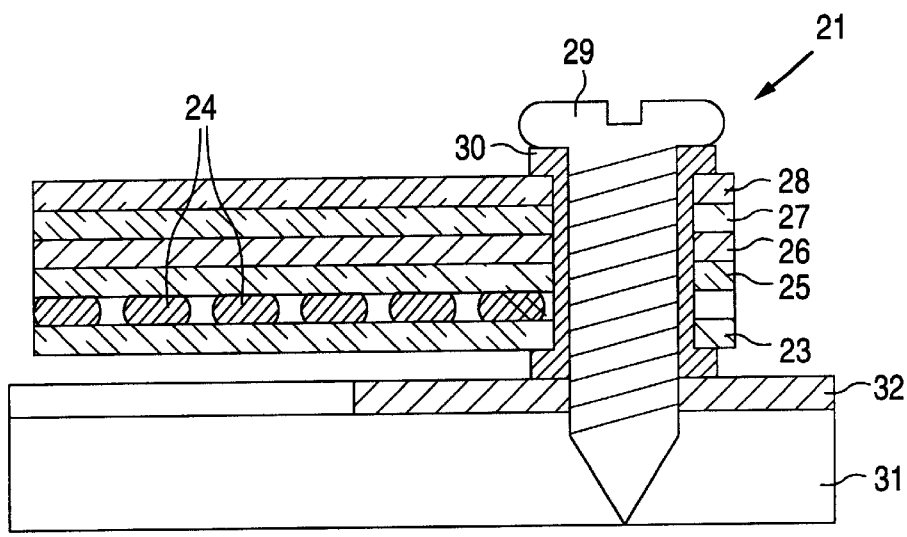
Figure 4:
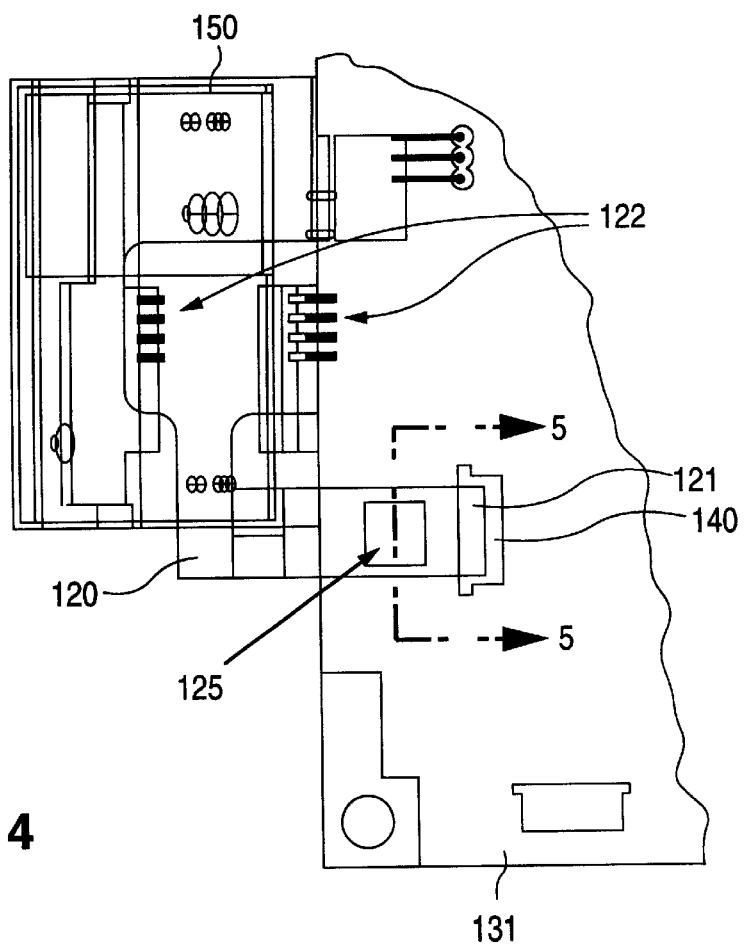
FIGS. 4, 5, 5A, 6, and 7 illustrate embodiments of the method and apparatus of this invention for connecting a ground shield plane of a flex cable to a grounding pad on a printed wire board.
Figure 5:
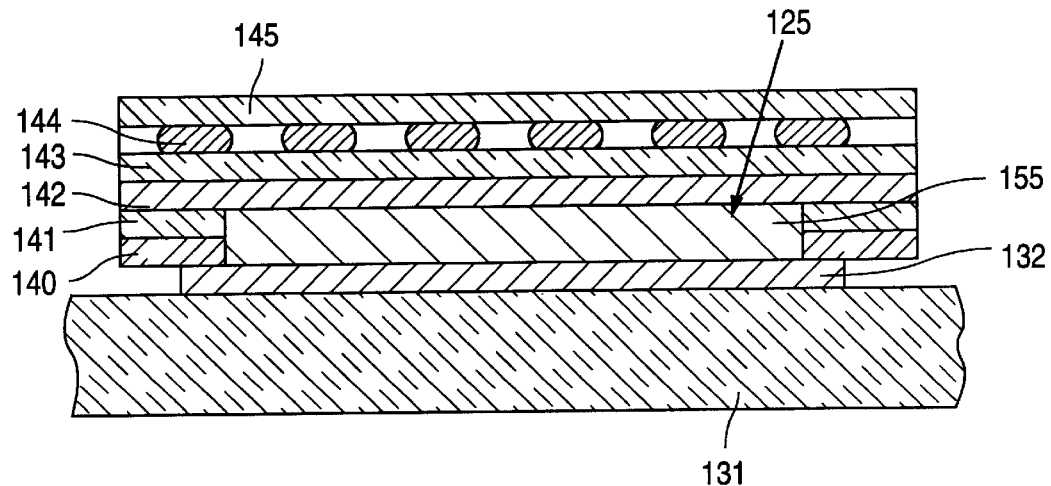
Figure 5A:
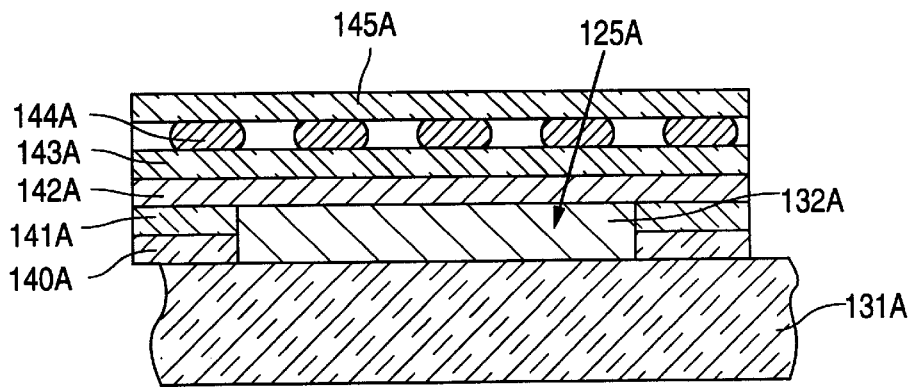
Figure 6:
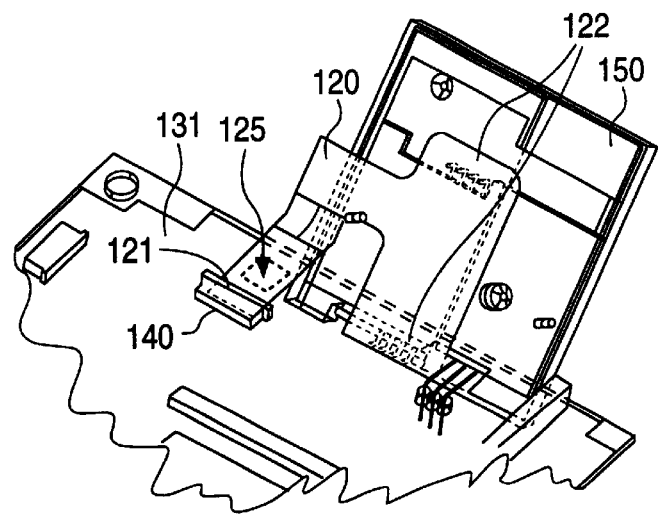
Figure 7:
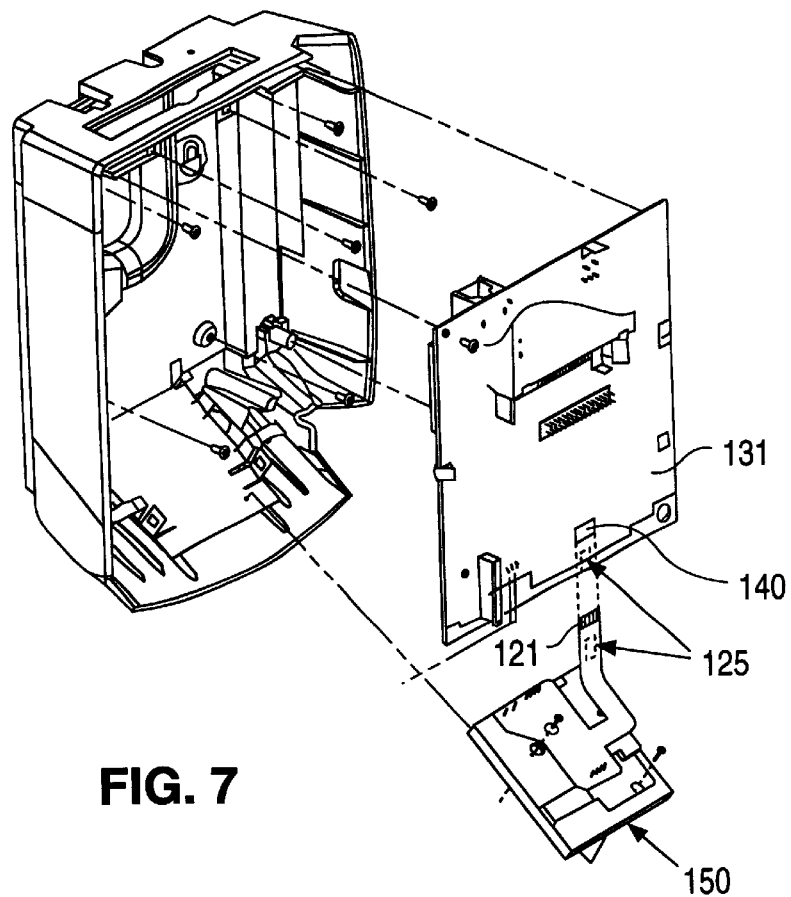

FIGS. 4, 6 and 7 illustrate the use of a flex cable 120 to connect a smart card reader/writer 150 to a printed wire board 131 in a transaction terminal. Flex cable 120 connects to one or more components on smart card reader/writer 150 at points 122 with internal conductive traces in flex cable 120. These conductive traces lead to connector end 121 on flex cable 120 which is inserted into connector 140 mounted on printed wire board 131. A grounding arrangement 125 is provided cooperatively between flex cable 120 and printed wire board 131 for grounding the internal conductive shielding layer 142 of flex cable 120 to a grounding pad 132 on printed wire board 131 as shown in the alternative embodiments of FIGS. 5 and 5A.

In FIG. 5, a layer of conductive adhesive 155 is formed in a window through stiffener layer 140 and polyamide layer 141 as shown. When flex cable 120 is pressed onto printed wire board 131 at that location a good broad area and low resistance electrical connection is made between conductive shield layer 142 and grounding pad 132.

This improves the EMI/ESD shielding performance of conductive shield layer 142 without adding costly extra manufacturing and assembly steps. This improvement is attained because this grounding method and apparatus comes closer to satisfying the rule of thumb for EMI/ESD shielding which is that optimum grounding is achieved for EMI and ESD purposes if a ratio of 4 to 1 is maintained for length to width in ground strap applications.

FIG. 5A illustrates that conductive adhesive layer 155 may be eliminated and grounding pad 132A on printed wire board 131A simply be pushed into direct contact with conductive shield layer 142A. This provides an effective ground connection and sufficient EMI/ESD shielding performance in some applications.

The above description of several invention embodiments are set forth as examples of the principles of this invention and it should be understood that numerous changes could be made by persons skilled in this art without departing from the principles and scope of the invention as claimed in the following claims.

What is claimed is:

1. A method for connecting a shielding ground plane of a flex cable to a grounding pad on a circuit item comprising one of a printed wire board or a metal chassis to which said flex cable is connected, said method comprising:

mounting a flex cable connector on said circuit item at a prearranged location;

forming on said circuit item a grounding pad positioned adjacent to the flex cable receiving portion of said flex cable connector;

forming on said flex cable adjacent to the connector card thereof an access window through one or more layers of the flex cable overlying said shielding ground plane to allow connection to said shielding ground plane of said flex cable;

inserting said connector end of said flex cable into said flex cable connector on said circuit item; and placing said access window in said flex cable over said grounding pad to make an electrical connection between said grounding pad and said shielding ground plane of said flex cable across the entire area of said access window.

2. The method of claim 1, further comprising:

forming a layer of conductive adhesive material filling said access window in said flex cable layers, or on said grounding pad, wherein said placing comprises pressing said flex cable and said circuit item together where said layer of conductive adhesive has been formed to adhere said exposed ground plane of said flex cable to said grounding pad and to provide electrical connection between said grounding pad and said shielding ground plane of said flex cable.

3. A grounding arrangement for a shielding ground plane of a flex cable used to provide electrical signal connections between a circuit item having a flex cable connector thereon and a physically separate electrical circuit element, said flex cable connector being mounted on said circuit item short distance from one edge thereof;

a grounding pad formed on said circuit item between said flex cable connector and said one edge of said circuit item;

an access window formed through one or more layers of said flex cable adjacent to tale connector end thereof to provide access to said shielding ground plane thereof; said window being adapted to provide electrical signal communication between said shielding ground plane of said flex cable and said grounding pad on said circuit item when said connector end of said flex cable is received in said flex cable connector.

4. The grounding arrangement of claim 3, further comprising a conductive adhesive formed on a selected one of said grounding pad and said shielding ground plane portion exposed through said access window for holding the exposed portion of said shielding ground plane in contact with said grounding pad and to provide electrical circuit connection therebetween.

* * * * *